United States Patent
Lee

(10) Patent No.: US 7,483,303 B2
(45) Date of Patent: Jan. 27, 2009

(54) FLASH MEMORY DEVICE WITH IMPROVED PROGRAM PERFORMANCE AND SMART CARD INCLUDING THE SAME

(75) Inventor: Byeong-Hoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/695,132

(22) Filed: Apr. 2, 2007

(65) Prior Publication Data
US 2008/0117689 A1 May 22, 2008

(30) Foreign Application Priority Data
Nov. 21, 2006 (KR) .................. 10-2006-0115389

(51) Int. Cl.
*G11C 16/04* (2006.01)
(52) U.S. Cl. .................. 365/185.18; 365/189.07; 365/189.09
(58) Field of Classification Search ............ 365/185.18, 365/185.23, 189.07, 189.09, 226
See application file for complete search history.

(56) References Cited

U.S. PATENT DOCUMENTS

| 5,946,258 | A * | 8/1999 | Evertt et al. ............ 365/226 |
| 6,229,732 | B1 * | 5/2001 | Lin et al. ............ 365/185.18 |
| 6,853,584 | B2 | 2/2005 | Nguyen et al. |
| 6,937,948 | B2 * | 8/2005 | Rajguru ............ 702/65 |
| 2003/0172309 | A1 | 9/2003 | Cioaca |
| 2005/0249022 | A1 * | 11/2005 | Martines et al. ........ 365/230.06 |

FOREIGN PATENT DOCUMENTS

| JP | 20030157679 | | 5/2003 |
| KR | 1020040002132 | A | 1/2004 |
| KR | 1020050109219 | A | 11/2005 |

* cited by examiner

*Primary Examiner*—Gene N. Auduong
(74) *Attorney, Agent, or Firm*—F. Chau & Assoc., LLC

(57) ABSTRACT

A flash memory device including: a memory cell array having memory cells arranged in rows and columns; and a high voltage generator configured to generate a high voltage supplied into a source line of the memory cell array during a programming operation. The high voltage generator operates to vary the high voltage along an amount of current supplied into the memory cell array during the programming operation.

14 Claims, 4 Drawing Sheets

FLASH MEMORY DEVICE WITH IMPROVED PROGRAM PERFORMANCE AND SMART CARD INCLUDING THE SAME

CROSS-REFERENCE TO RELATED APPLICATION

This U.S. non-provisional patent application claims priority under 35 U.S.C. § 119 of Korean Patent Application No. 2006-115389 filed on Nov. 21, 2006, the entire contents of which are hereby incorporated by reference.

BACKGROUND

The present disclosure relates to semiconductor integrated circuit devices and, more particularly, to a flash memory device and a smart card including the same.

Semiconductor memory devices are generally classified into volatile or nonvolatile depending on whether memory data can be retained or not in the absence of a power supply. Random access memories, such as SRAM and DRAM, are typically volatile memory devices. Nonvolatile memory devices include various kinds of read-only memories (ROMs), for example, erasable and programmable ROMs (EPROMs), electrically erasable and programmable ROMs (EEPROMs), and flash memories.

Recently, flash memory devices are becoming highly interesting to designers in view of their merits of small size, low power consumption, and advanced performance of reading/writing. For example, flash memory devices are usually employed in providing an on-chip memory system for portable apparatuses, such as cellular phones, digital cameras, audio/video recorders, modems, smart cards, and so forth. Those portable apparatuses are required to contain information that needs a fast data update.

A flash memory cell, for example, a split-gate flash memory cell is operable with the mechanism of F-N tunneling for erasing data of the memory cell or source-side channel hot electron injection for programming data therein. To accomplish the source-side channel hot electron injection for a memory cell to be programmed, a word line of the selected memory cell is driven with a voltage of about 1.2 V and a source line of the selected memory cell is driven with a voltage of about 9V. For data to be programmed (that is, program data), a bit line of the selected memory cell may be driven with a voltage of about 0.3V. According to this bias condition, a current flows from the bit line to the source line through the selected memory cell, which means there is an actual current consumption. On the other hand, for data to be inhibited against programming (that is, program-inhibited data), a bit line of a selected memory cell may be driven by a power source voltage, which makes the selected memory cell turned off to interrupt a current toward the bit line from the source line.

According to a previously known method of programming, an amount of current dissipated during the programming operation may be variable based on the number of data bits to be programmed. This means a voltage of the source line becomes lower in view of the dissipated amount of current during the programming operation. As a result, such a voltage drop on the source line may cause a degradation in program characteristics of the memory cells.

Therefore, a new technique is needed to maintain a rate of current consumption at a constant level, regardless of the number of data bits to be programmed.

SUMMARY OF THE INVENTION

Exemplary embodiments of the present invention are directed to a flash memory device capable of maintaining a rate of current consumption on a constant level, regardless of the number of data bits to be programmed, and a smart card including the flash memory device.

Exemplary embodiments of the present invention are directed to a flash memory device capable of varying a high voltage in accordance with an amount of current consumption without using program data, and a smart card including the flash memory device.

An exemplary embodiment of the present invention is a flash memory device including: a memory cell array having memory cells arranged in rows and columns; and a high-voltage generator configured to generate a high voltage supplied to a source line of the memory cell array during a programming operation. The high-voltage generator operates to vary the high voltage based on an amount of current supplied to the memory cell array during the programming operation.

In an exemplary embodiment, when the amount of current supplied to the memory cell array becomes larger during the programming operation, the high-voltage generator operates to increase the high voltage without using the data to be programmed.

In an exemplary embodiment, the high-voltage generator operates to generate the high voltage with an increasing rate that goes higher, when an amount of consuming current is relatively larger than when the amount of consuming current is relatively smaller.

In an exemplary embodiment, the memory cells are split-gate flash memory cells.

In an exemplary embodiment, the high-voltage generator includes: a pump circuit; a voltage divider having a predetermined resistance value to divide the high voltage; a comparator operating to compare a reference voltage with a divisional voltage divided by the voltage divider; a driver supplying a current to an output terminal of the high voltage from the pump circuit in response to an output of the comparator; a detector operating to detect an amount of current flowing through the driver in response to the output of the comparator and generating a detection voltage in proportion to the detected amount of current; and a variable resistor circuit responding to the detection voltage and varying a resistance value of the comparator so as to increase the high voltage.

In an exemplary embodiment, the voltage divider includes first and second resistors serially connected between the output terminal of the high voltage and a ground voltage terminal. The variable resistor circuit includes an NMOS transistor having: a drain connected to a connection node of the first and second resistors through a third resistor; a source connected to the ground voltage terminal; and a gate coupled to respond to the detection voltage.

In an exemplary embodiment, an increasing level of the detection voltage is proportional to an increase of the amount of current flowing through the driver.

An exemplary embodiment of the present invention provides a flash memory device having split-gate flash memory cells arranged in rows and columns, including: a row selector configured to select the rows; a column selector configured to select the columns; a write driver configured to drive the selected columns with a program voltage and a program-inhibition voltage in response to input data; a pump circuit configured to generate a pumping voltage; and a regulator adjusting the pumping voltage and generating a high voltage to be supplied to a source line of a selected split-gate flash memory cell. When an amount of current supplied into the source line becomes larger during a programming operation, the regulator operates to increase the high voltage without using the data to be programmed.

In an exemplary embodiment, the regulator includes: a voltage divider having a predetermined resistance value to divide the high voltage; a comparator operating to compare a reference voltage with a divisional voltage divided by the voltage divider; a driver supplying a current to an output terminal of the high voltage from the pump circuit in response to an output of the comparator; a detector operating to detect an amount of current flowing through the driver in response to the output of the comparator and generating a detection voltage in proportion to the detected amount of current; and a variable resistor circuit responding to the detection voltage and varying a resistance value of the comparator so as to increase the high voltage.

In an exemplary embodiment, the voltage divider includes first and second resistors serially connected between the output terminal of the high voltage and a ground voltage terminal. The variable resistor circuit includes an NMOS transistor having: a drain connected to a connection node of the first and second resistors through a third resistor; a source connected to the ground voltage terminal; and a gate coupled to respond to the detection voltage.

In an exemplary embodiment, an increasing level of the detection voltage is proportional to an increase of the amount of current flowing through the driver.

In an exemplary embodiment, the regulator generates the high voltage with an increasing level that is higher when the amount of current flowing through the driver is relatively larger than when the amount of current flowing through the driver is relatively smaller.

In an exemplary embodiment, the variable resistor circuit reduces a resistance value of the second resistor in proportion to an increasing level of the detection voltage.

A further understanding of the nature and advantages of exemplary embodiments the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the following figures, wherein like reference numerals refer to like parts throughout the various figures unless otherwise specified. In the figures.

DETAILED DESCRIPTION OF EXEMPLARY EMBODIMENTS

Figure 1:
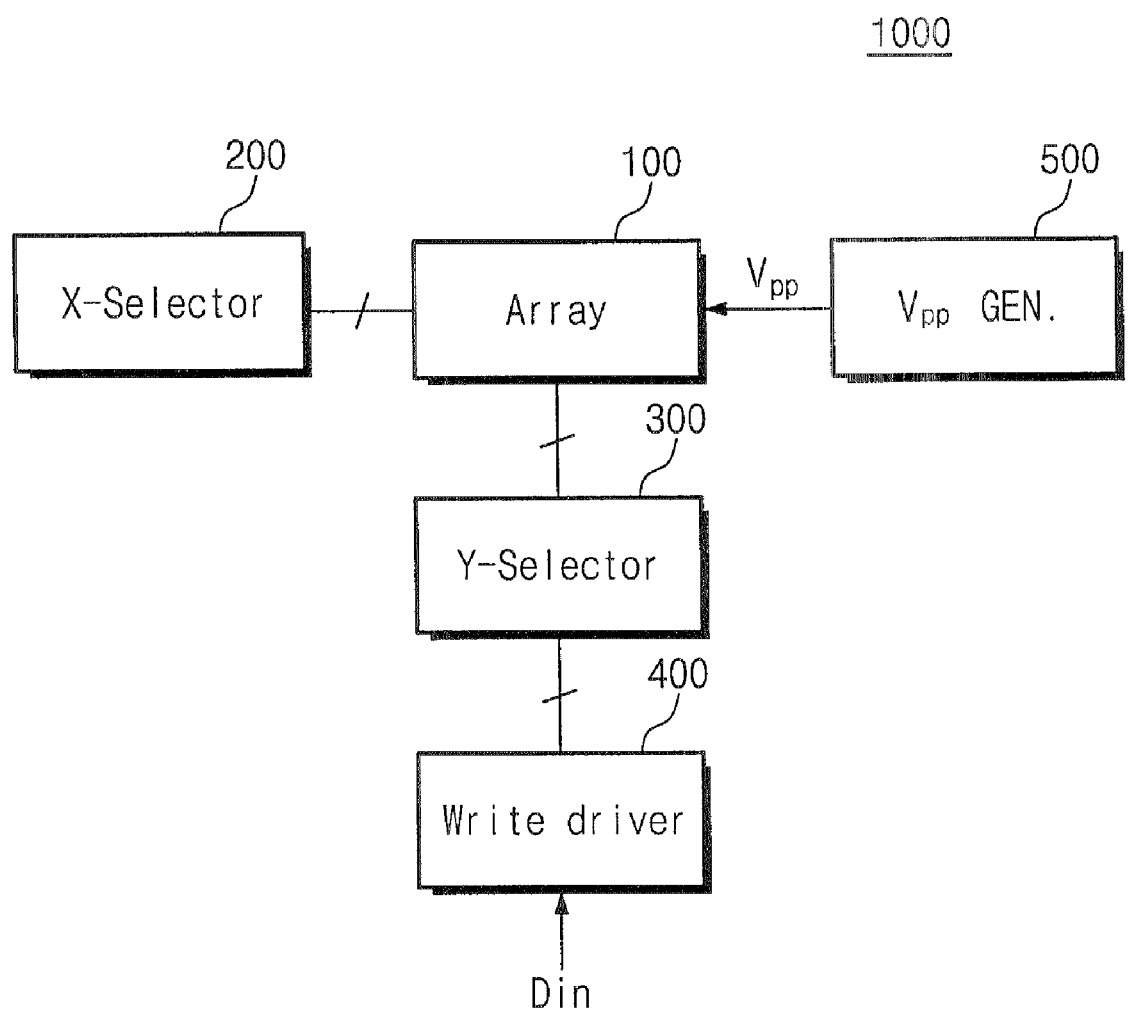
FIG. 1 is a block schematic illustrating a flash memory device in accordance with an exemplary embodiment of the present invention.

Exemplary embodiments of the present invention will be described below in more detail with reference to the accompanying drawings, providing a split-gate flash memory device as an example for illustrating structural and operational features by the invention. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

FIG. 1 is a block schematic illustrating a flash memory device in accordance with an exemplary embodiment of the present invention.

Referring to FIG. 1, the flash memory device 1000 includes a memory cell array 100 storing N-bit data (N is a positive integer). Although not shown, the memory cell array 100 may be organized of memory cells arranged in rows (or word lines) and columns (or bit lines). The memory cells may be formed of, for example, split-gate flash memory cell transistors that are erased by F-N tunneling and programmed by source-side channel hot electron injection. But it will be appreciated by those of ordinary skill in the art that the structural configuration of the memory cells need not be limited to that exemplary embodiment. Rows of the memory cell array 100, that is, word lines, are selected and driven by a row selector (or X-selector) 200. A column selector (or Y-selector) 300 operates to select columns of the memory cell array 100, that is, bit lines, in predetermined units (for example, x32). Selected bit lines are connected to a write driver 400. The column selector 300 is configured to drive non-selected bit lines with a power source voltage during a programming operation and with a ground voltage during an erasing/programming operation. The write driver 400, during the programming operation, drives bit lines, which are selected according to input data Din, with a program voltage or a program-inhibition voltage. For instance, if input data is program data, the write driver 400 drives a selected bit line with the program voltage (for example, 0.3V). If input data is program-inhibited data, the write driver 400 drives a selected bit line with the program-inhibition voltage (for example, Vdd).

Referring to FIG. 1, the flash memory device 1000 further includes a high voltage generator 500 for generating a high voltage Vpp to be supplied into the memory cell array 100. The high voltage Vpp, for example, about 9V, is supplied to a source line of selected memory cells during the programming operation. The high-voltage generator 500 according to an exemplary embodiment of the present invention is configured to generate the high voltage Vpp that is variable based on an amount of current consumed during the programming operation. For instance, the high voltage Vpp increases as the amount of current consumed becomes larger and decreases as the amount of current consumed becomes smaller. A large amount of current consumed during the programming operation means that there are a lot of memory cells being programmed at the same time. In this case, a voltage of the source line may be lowered. On the other hand, according to an exemplary embodiment of the present invention, when the amount of current consumed during the programming operation becomes larger, the high voltage Vpp rises in proportion to an increase of the amount of current consumed. Thus, it is possible to maintain a voltage of the source line on a target level with reference to a selected memory cell.

Examples of conditions for the programming, erasing, and reading operations are set forth in the following chart.

TABLE 1

|  | Word line | Bit line | Source line |
|---|---|---|---|
| Program | 1.2 V | 0.3 V | 9 V |
| Erase | 12 V | 0 V | 0 V |
| Read | Vdd (Vread) | 0.7 V | 0 V |

Figure 2:
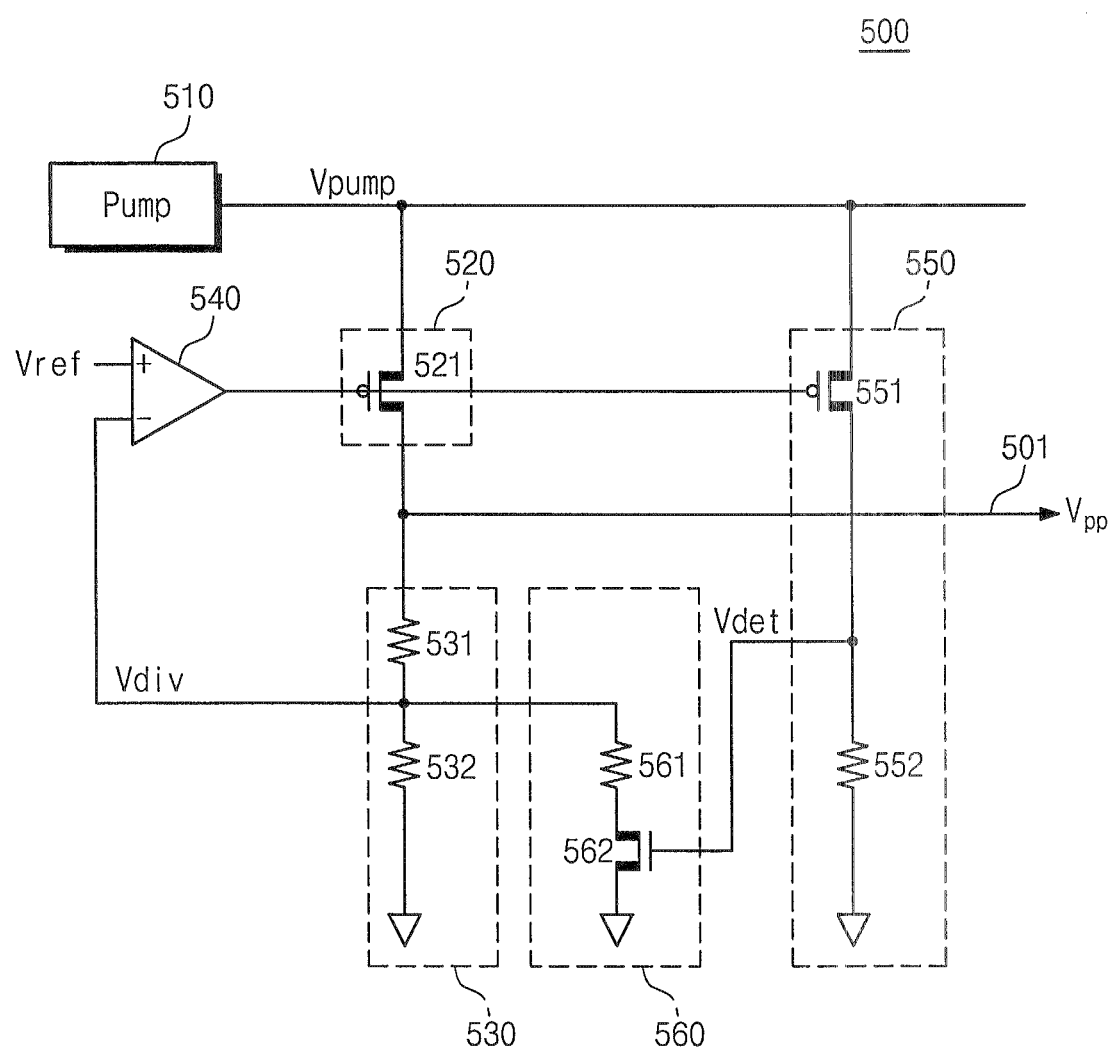
FIG. 2 is a circuit diagram illustrating a high voltage generator shown in FIG. 1.

FIG. 2 is a circuit diagram illustrating the high-voltage generator 500 shown in FIG. 1.

Referring to FIG. 2, the high voltage generator 500 is comprised of a pump circuit 510, a driver 520, a voltage divider 530, a comparator 540, a detector 550 and a variable resistor circuit 560. The pump circuit 510 is configured to generate a pumping voltage Vpump that is higher than the high voltage Vpp, and the construction of which is well known by those with ordinary skill in the art. The driver 520 is formed of a PMOS transistor 521 connected between the pumping voltage Vpump and the high voltage Vpp, supplying a current to an output terminal 501 under control of the comparator 540. The voltage divider 530 generates a divisional voltage Vdiv by dividing the high voltage Vpp and is composed of resistors 531 and 532 serially connected between the output terminal 501 and a ground voltage terminal. The comparator 540 operates to compare the divisional voltage Vdiv with a reference voltage Vref and then controls the driver 520 in accordance with a result of the comparison. For instance, if the divisional voltage Vdiv is lower than the reference voltage Vref, the comparator 540 outputs a low-level signal to supply a current to the output terminal 501 through the PMOS transistor 521 of the driver 520. Then, the high voltage Vpp increases. On the other hand, if the divisional voltage Vdiv is equal to or higher than the reference voltage Vref, the comparator 540 generates a high-level signal to turn off the PMOS transistor 521 of the driver 520. The high voltage Vpp, as well known, is given by Vref*((R1+R2)/R2), where R1 and R2 denote resistance values of the resistors 531 and 532 respectively.

As shown in FIG. 2, the detector 550 is composed of a PMOS transistor 551 and a resistor 552 and generates a detection voltage Vdet that is proportional to a flowing current in response to an output of the comparator 540. The detection voltage Vdet is proportional to an amount of current flowing through the PMOS transistor 551. In response to an increase in the amount of current through the PMOS transistor 551, the detection voltage Vdet also rises. As described above, the increase in the amount of current means a drop in the high voltage Vpp. The variable resistor circuit 560 is composed of a resistor 561 and an NMOS transistor 562, operating to reduce a resistance value of the voltage divider 530, that is, being in parallel with the resistance value R2 of the resistor 532, in response to the detection voltage Vdet provided from the detector 550. In response to a decrease in the effective resistance value of the resistor 532, the high voltage Vpp goes higher. Further, a turn-on resistance value of the NMOS transistor 562 is higher when the detection voltage Vdet is relatively lower than when the detection voltage Vdet is relatively higher. Thus, an increasing level of the high voltage Vpp is relatively higher when the amount of current being consumed is larger than when the amount of current being consumed is smaller.

In this exemplary embodiment, the driver 520, the voltage divider 530, the comparator 540, the detector 550, and the variable resistor circuit 560 are employed to constitute a regulator for adjusting the pumping voltage Vpump and generating the high voltage Vpp. The transistors forming the high-voltage generator 500 are all high-voltage transistors.

Figure 3:
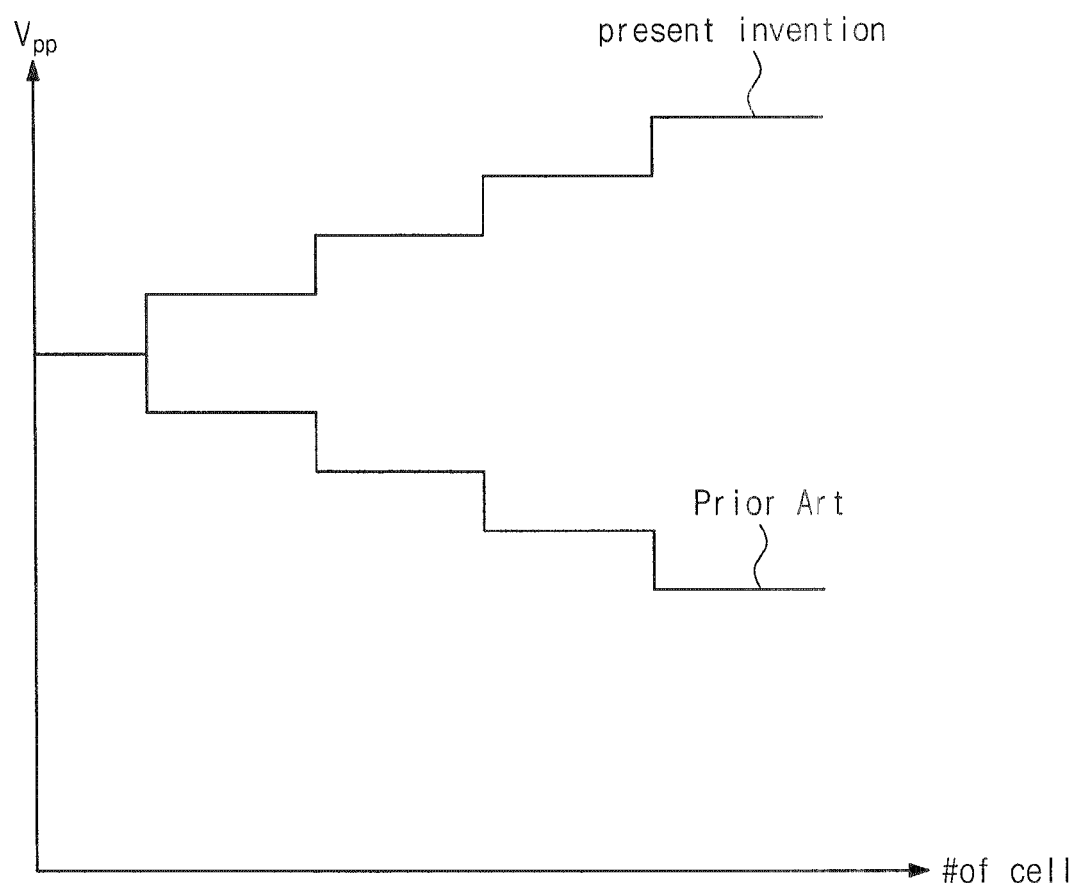
FIG. 3 shows a waveform from the high voltage generator shown in FIG. 2.

As can be seen from the above description and as shown in FIG. 3, it is usual for the high voltage Vpp to be lower in response to an increase in the number of data bits being programmed at the same time, when a programming operation is being conducted in a general flash memory device. As also shown in FIG. 3, however, the high voltage Vpp in the flash memory device according an exemplary embodiment of to the present invention rises along with an increase in the number of data bits being programmed at the same time. In the exemplary embodiments of the present invention, raising the high voltage Vpp does not rely on detecting data being programmed. In other words, it is possible to increase the high voltage Vpp by sensing the amount of current being consumed through the detector 550 without using the data to be programmed. More specifically, by compensating the high voltage Vpp in proportion to a voltage that is reduced due to the programming operation, it is possible to supply the high voltage Vpp on a target level with reference to a memory cell.

Figure 4:
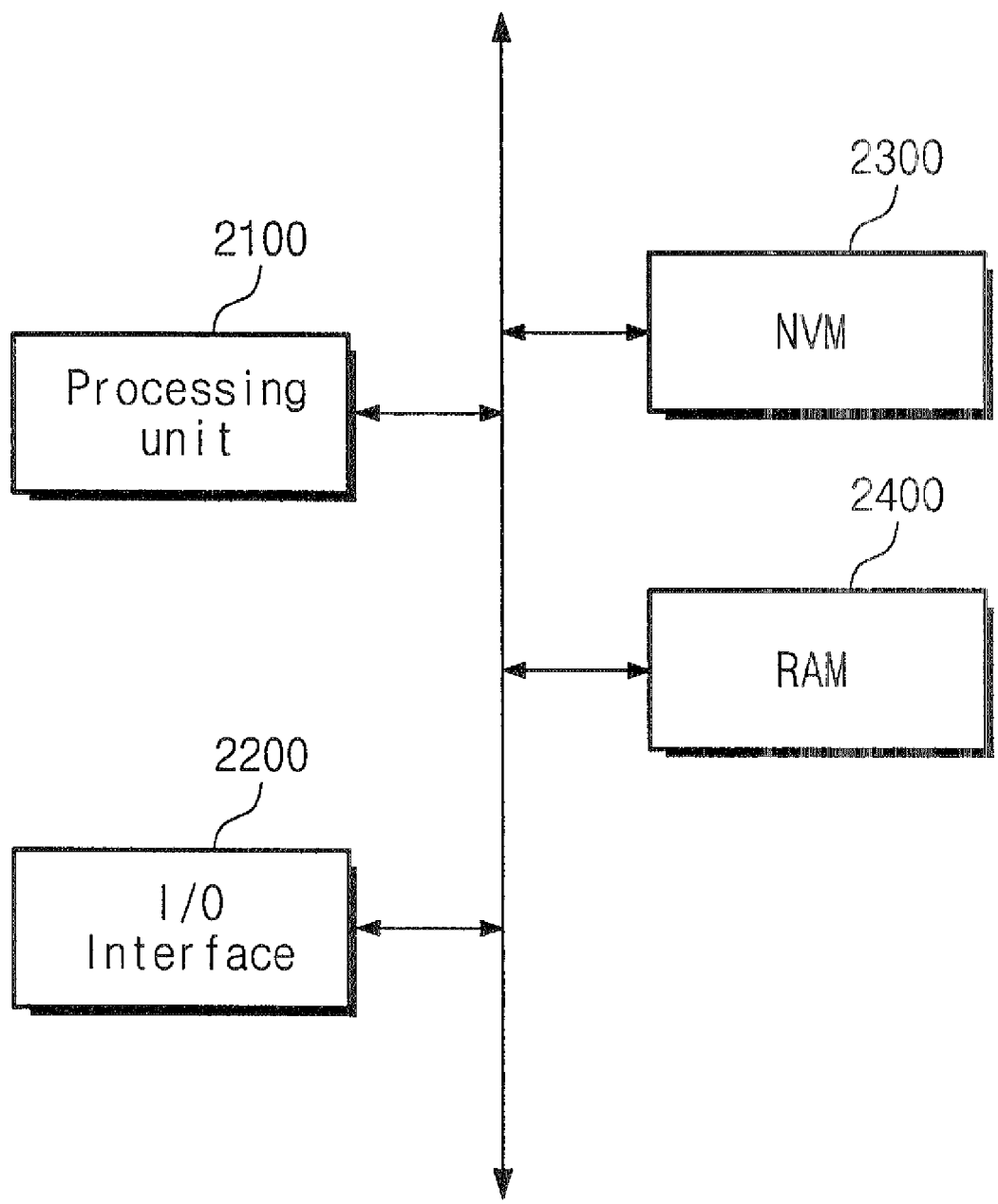
FIG. 4 is a block schematic illustrating a smart card including the flash memory device shown in FIG. 1.

FIG. 4 is a block schematic illustrating a smart card including the flash memory device shown in FIG. 1.

Referring to FIG. 4, the smart card is organized to include a processing unit 2100, such as a central processing unit or a microprocessor, an input/output (370) interface 2200 for (wired and/or wireless) communication with an external system (for example, a card reader), a nonvolatile memory device (NVM) 2300 used as a data or program memory unit, and a random access memory (RAM) 2400. The nonvolatile memory device 2300 is substantially the same as that shown in FIG. 1, so it will not be further described. Although not shown, the smart card may further include an encryption and decryption processing unit, an error correction unit, a hacking-protection security sensing unit, a memory management unit, and so on.

As described above, it is possible to improve the program characteristics of a flash memory device by increasing the high voltage Vpp along with an amount of current consumed during the programming operation, without using the data to be programmed.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
   a memory cell array having memory cells arranged in rows and columns;
   a high-voltage generator configured to generate a high voltage supplied to source line of the memory cell array during a programming operation of the memory cell array; and
   a current detector configured to detect an amount of current supplied to the memory cell array,
   wherein the high-voltage generator operates to vary the high voltage in response to an amount of the current supplied to the memory cell array during the programming operation as detected by the current detector.

2. The flash memory device as set forth in claim 1, wherein when the amount of current supplied to the memory cell array becomes larger during the programming operation, the high-voltage generator operates to increase the high voltage without using the data to be programmed.

3. The flash memory device as set forth in claim 2, wherein the high-voltage generator operates to generate the high voltage with an increasing level that is higher when an amount of current being consumed is relatively larger than when the amount of current being consumed is relatively smaller.

4. The flash memory device as set forth in claim 1, wherein the memory cells comprise split-gate flash memory cells.

5. The flash memory device as set forth in claim 1, wherein the high-voltage generator comprises:
a pump circuit;
a voltage divider having a predetermined resistance value to divide the high voltage;
a comparator operating to compare a reference voltage with a divisional voltage divided by the voltage divider;
a driver supplying a current to an output terminal of the high voltage from the pump circuit in response to an output of the comparator; and
a variable resistor circuit responding to the current detector and varying a resistance value to vary the divisional voltage fed to the comparator so as to increase the high voltage,
wherein the current detector detects an amount of the current flowing through the driver in response to the output of the comparator to vary the high voltage of the high-voltage generator.

6. The flash memory device as set forth in claim 5, wherein the voltage divider comprises first and second resistors serially connected between the output terminal of the high voltage and a ground voltage terminal,
wherein the variable resistor circuit comprises a third resistor and an NMOS transistor having: a drain connected to a connection node of the first and second resistors through the third resistor; a source connected to the ground voltage terminal; and a gate coupled to respond to the detection voltage.

7. The flash memory device as set forth in claim 5, wherein an increasing level of an output of the current detector is proportional to an increase of the amount of current flowing through the driver.

8. A flash memory device having split-gate flash memory cells arranged in rows and columns, comprising:
a row selector configured to select the rows;
a column selector configured to select the columns;
a write driver configured to drive the selected columns with a program voltage and a program-inhibition voltage in response to input data fed thereto;
a pump circuit configured to generate a pumping voltage;
a regulator adjusting the pumping voltage and generating a high voltage to be supplied to a source line of a selected split-gate flash memory cell; and
a current detector configured to detect an amount of current supplied to the source line of the memory cell array,
wherein when an amount of current supplied into the source line becomes larger during a programming operation, the regulator operates to increase the high voltage using only an output of the current detector and without using the data to be programmed.

9. The flash memory device as set forth in claim 8, wherein the regulator comprises:
a voltage divider having a predetermined resistance value to divide the high voltage;
a comparator operating to compare a reference voltage with a divisional voltage divided by the voltage divider;
a driver supplying a current to an output terminal of the high voltage from the pump circuit in response to an output of the comparator;
a variable resistor circuit responding to the current detector and varying a resistance value of the comparator so as to increase the high voltage,
wherein the current detector detects an amount of the current flowing through the driver in response to the output of the comparator to vary the high voltage of the high-voltage generator.

10. The flash memory device as set forth in claim 9, wherein the voltage divider comprises first and second resistors serially connected between the output terminal of the high voltage and a ground voltage terminal,
wherein the variable resistor circuit comprises an NMOS transistor having: a drain connected to a connection node of the first and second resistors through a third resistor; a source connected to the ground voltage terminal; and a gate coupled to respond to the detection voltage.

11. The flash memory device as set forth in claim 9, wherein an increasing level of an output of the current detector is proportional to an increase of the amount of current flowing through the driver.

12. The flash memory device as set forth in claim 9, wherein the regulator generates the high voltage with an increasing level that is higher when the amount of current flowing through the driver is relatively larger than when the amount of current flowing through the driver is relatively smaller.

13. The flash memory device as set forth in claim 9, wherein the variable resistor circuit reduces a resistance value of the second resistor in proportion to the current detected by the current detector.

14. A smart card comprising:
a flash memory device;
the flash memory device including:
a memory cell array having memory cells arranged in rows and columns; and
a high-voltage generator configured to generate a high voltage supplied to a source line of the memory cell array during a programming operation of the memory cell array,
a current detector configured to detect an amount of current supplied to the source line of the memory cell array,
wherein the high-voltage generator operates to vary the high voltage in response to an amount of the current supplied to the memory cell array during the programming operation.

* * * * *